March 25, 1969 E. R. BEAVER, JR 3,434,888

INCASED GRAPHITE SEGMENTED THERMOELEMENT

Filed Oct. 22, 1965

INVENTOR.
EMIL R. BEAVER

BY Mary B. Moshier

ATTORNEY

United States Patent Office 3,434,888

Patented Mar. 25, 1969

3,434,888

INCASED GRAPHITE SEGMENTED THERMOELEMENT

Emil R. Beaver, Jr., Tipp City, Ohio, assignor to Monsanto Research Corporation, St. Louis, Mo., a corporation of Delaware Filed Oct. 22, 1965, Ser. No. 500,633
Int. Cl. H01v *1/28*
U.S. Cl. 136—203 4 Claims This invention relates to power generating devices and the like and more particularly relates to means of converting thermal energy into electrical energy in thermoelectric generators and cooling devices. More specifically, the invention provides new and valuable, incased thermoelements for use as thermocouple legs of such devices and the method of producing the same.

Figure 1:
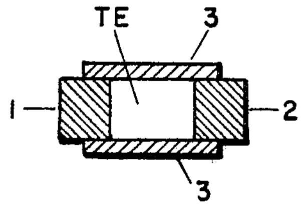

In accordance with the Seebeck effect, electromotive force is produced when one thermoelectric element is joined to a dissimilar thermoelectric element to form a circuit and their two junctions are maintained at different temperatures. This effect is utilized in thermoelectric generators, whereby electrical power is generated when heat is applied at one junction and rejected at the other.

For environmental cooling, rather than generation of electricity, there is utilized the Peltier effect wherein the above described circuit of dissimilar thermoelectric materials is also used. However, instead of applying heat at one junction and rejecting it at another, an electrical current is passed through the circuit causing cooling at one junction and heating at another. A transfer of heat from the ambient environment and through the device is thus effected, resulting in refrigeration.

In thermoelectric generators and other devices which are dependent on either the Seebeck effect or the Peltier effect one junction of a thermoelement must be maintained at a temperature which is higher than that of another; hence, the two junctions are commonly referred to as either the hot junction or the cold junction.

The effect of temperature on the electrical resistance of the thermoelectric material is also critical. In determining the efficiency of the material, there is used the following relationship, wherein Z is the figure of merit:

$$Z = S^2/\rho K$$

in which S is the Seebeck coefficient, $\rho$ is the electrical resistivity and K is the thermal conductivity. The higher the figure of merit, the better the efficiency. Electrical resistivity should thus be as low as possible.

Thermoelectric materials generally comprise semiconductors, of which silicon, germanium-silicon, boron, carbon-boron, lead-tellurium and chromium-antimony are examples, together with additives for determining the direction of current flow, i.e., certain impurities which are commonly referred to as dopants, and other materials which may serve to modify thermal properties or to contribute to over-all thermoelectric efficiency. Mixtures of such components are formed into compacts by hot-pressing operations; thereby consolidation of the components to a solid, shaped body is achieved. For generation of electricity, one portion of the compacted body must be subjected to heat, while an opposite portion is being cooled. Transfer of heat is required in refrigeration. In order to improve absorption and release of heat and to provide for an electrical circuit, the compact of thermoelectric material is usually fixed or bonded to a thermal and electrical conductor at one portion and to a radiator and an electrical conductor at an opposite portion. Unfortunately, however, the compacts often possess such poor mechanical strength that they break when subjected to the shear or tensile stress involved in screwing or dovetailing the necessary elements to them. Bonding by means of organic adhesives is usually unsatisfactory owing to thermal instability of the bond and its poor effect on electrical resistivity.

One expedient which has been used to overcome these difficulties is to fix to the thermoelectric composition, during compacting, material which possesses very good mechanical strength over a wide temperature range and which permits flow of heat and electricity. Graphite has been used for this purpose. Thus, in preparing a thermoelement from a finely comminuted thermoelectric formulation, the compression die is charged successively with a first disc of graphite, the thermoelectric formulation, and a second disc of graphite. Hot pressing gives an integral unit wherein a layer of graphite is firmly bonded at each end of the compacted thermoelectric. The graphite ends are then employed as construction bases to which the other components of a thermoelectric device are readily fixed. However, the electrical resistance of the unit is somewhat increased as a result of including the graphite, and occasionally the thermoelectric/graphite bond fails at the hot-end in high temperature thermoelectric applications.

Also, as disclosed in the copending application of Emil R. Beaver, Jr., and Robert G. Ault, Sr., No. 385,648, filed July 28, 1964, thermoelements consisting of discrete segments of different thermoelectric compositions are readily prepared by using a layer of graphite between the different thermoelectric materials. The graphite serves as a diffusion barrier and also as a bonding means, since compacting results in a tenacious bond between the graphite and the thermoelectric materials. The use of graphite as a means of uniting segments of two different thermoelectric materials constitutes a significant advance in the art because there is thereby obtained an integral unit wherein interpenetration of one thermoelectric material into the other is not encountered and there is less effect on the electrical resistance of the finished unit than if the two thermoelectric materials had been compacted without the interleaf of graphite or if two different thermoelectric shaped bodies had been bonded together by means of an organic adhesive. However, the electrical resistance of the graphite-bonded segmented thermoelement is greater than that of each thermoelectric segment; and the bonding through graphite, of two thermoelectric segments having different thermal stability frequently does not guard against thermal failure of the bond between the graphite and the less thermally stable material.

Accordingly, an object of the invention is to decrease the electrical resistance of thermoelements comprising at least one layer of graphite bonded, by hot-pressing, to a shaped body of thermoelectric material. Another object is to improve the thermal stability of a thermoelement wherein a formed layer of thermoelectric material has been bonded to graphite by a hot-pressing operation. A further object is to decrease the electrical resistance and improve the thermal stability of a segmented thermoelement wherein at least two segments of thermoelectric materials are bonded together by a layer of graphite.

These and other objects hereinafter defined are met by the following invention wherein there is provided a thermoelement unit comprising a formed layer of thermoelectric material which has been bonded to a formed layer of graphite and a tightly adherent graphite casing overlapping the junction of the layer of graphite with the thermoelectric material.

In one embodiment, the invention provides a thermoelement comprising a graphite hot-end, a graphite cold-end, thermoelectric material positioned between said ends and firmly bonded thereto, and a graphite casing firmly bonded to and circumferentially overlapping the junctions of the thermoelectric material with the graphite ends and extending over the entire exterior surface of the thermoelectric material. The invention also includes a thermoelement having a hot-end and a cold-end as described above but having the graphite casing overlapping only one of said junctions.

In another embodiment of the invention, there is provided a thermoelement comprising a shaped body having segments of two different thermoelectric materials bonded together by a layer of graphite and having a graphite casing firmly bonded to and circumferentially extending over the external surface of the graphite layer and overlapping the junctions of said layer with the thermoelectric materials. The thermoelement may have a plurality of segments. In such a case, a segment of thermoelectric material alternates with the bonding layer of graphite, with each segment being positioned to give along the thermoelement a gradient in the temperature to figure-of-merit ratios of the thermoelectric materials. A graphite casing overlaps at least one of the bonding layers and junctions as set forth above. Either the bi-segmented or the multi-segmented thermoelement may have hot- and/or cold-ends of graphite. The graphite casing may be bonded to the entire exterior surface of the segmented elements, thereby overlapping the thermoelectric material or materials, the graphite, and the junction or junctions therebetween. Thus, when the thermoelement consists of more than one layer of graphite, as when there is present a graphite hot-end and a graphite cold-end so that two graphite/thermoelectric junctions are present, both junctions are conveniently overlapped by using a single casing which overlaps each junction and extends over the entire outer surface of the thermoelectric material. The thermoelement thus obtained is shown in FIGURE 1 of the drawings, wherein TE denotes the thermoelectric material, elements 1 and 2 are the graphite hot- and cold-ends, respectively, and element 3 is a hollow tubular member which envelops all but the terminal portions of a cylindrical thermoelement and overlaps the junctions of end 1 with the thermoelectric material and also the junction of end 2 with the same material.

Figure 2:
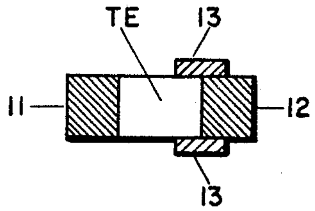

In some instances, as for example, in dealing with thermoelements designed for space applications, weight is of considerable importance. Hence, the contribution of a casing to the efficiency of a system must be sufficient to warrant its additional weight. We have found that the additional electrical resistance which results from the junction of a layer of thermoelectric material with a layer of graphite is substantially reduced when a casing is used to overlap only the junction at the hot-end of the thermoelement. Such an arrangement is depicted in FIGURE 2 of the drawings wherein element 13 is an annular member positioned upon and tightly bonded to the external surface of the thermoelement to overlap the junction between the thermoelectric TE and the graphite hot-end 12. The thermoelement of FIGURE 2 is readily prepared by loading a graphite liner with a layer of graphite, then with the thermoelectric material and finally with a layer of graphite, inserting the loaded liner into the die and compressing to get an integral unit consisting of the liner and its compacted load, and then machining the unit to remove all of the liner except that which covers the junction and from about 0.01 to 1.0" of the surface area adjacent to each side of the junction, thereby leaving on the thermoelement only that portion of the graphite liner which is shown in FIGURE 2 as the annular member 13. Thereby, the thermoelement is mechanically strengthened at the hot-end and electrical resistance is decreased. These advantages more than compensate for the weight of the annular member.

Figure 4:
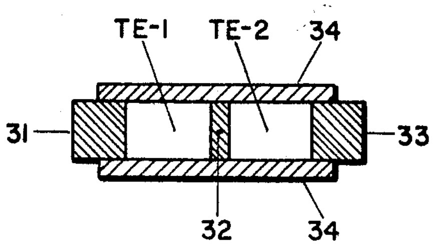
Figure 5:
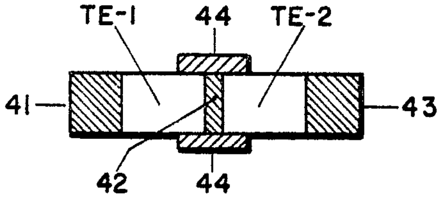

The presently provided process of lowering the electrical resistance while realizing increased mechanical strength is particularly valuable when it is used in the manufacture of segmented thermoelectric materials wherein at least two different thermoelectric materials are compression-joined through a graphite layer. All of the thermoelement except the outer surface of the graphite cold-end may be enveloped in graphite, as shown in FIGURE 4 of the drawings wherein member 34 is a graphite casing obtained from a die liner in which there has been compressed the graphite cold-end 33, the comparatively low temperature thermoelectric material TE–2, graphite bonding layer 32, the high temperature thermoelectric material TE–1 and the graphite hot-end 31. Advantageously, the thermoelement of FIGURE 4 is manufactured by first hot-pressing a compact consisting successively of the graphite layer 31, thermoelectric material TE–1 and graphite layer 32 and then using this compact as the die ram for a charge of graphite layer 33 and thermoelectric TE–2 in the graphite liner 34. During compression, the charge and the ram become bonded to each other and to the graphite liner. The resulting thermoelement is characterized by extremely good mechanical strength and low electrical resistance. If weight is critical, it can be machined to leave only that portion or portions of the liner wherein electrical resistance and strength characteristics require most improvement. When a thermoelement is made up of discrete segments of thermoelectrical materials, the bonding area is usually the most fallible. Accordingly, when only a portion of the graphite liner is to be retained, it will be generally preferred to retain that portion which covers the graphite bonding layer between the two segments and overlaps each of the two graphite/thermoelectric junctions. Annular member 44 of FIGURE 5 is such a portion. It completely envelops the bonding layer 42 and overlaps the junction of said layer with the thermoelectric material TE–1 and also the junction of the same layer with the thermoelectric material TE–2.

The presently provided thermoelements may contain any thermoelectric material which has been bonded to graphite by hot-pressing to one layer of graphite or between two layers of graphite, or it may contain two or more different thermoelectric materials bonded together by a layer or layers of graphite. The thermoelement may or may not include cold- or hot-ends of graphite or of other thermally and electrically conducting material. The thermoelectric materials may comprise any solid, metallic or semi-metallic semi-conductors. Examples of some suitable high temperature thermoelectrics are the boron-based materials disclosed in the Courtland M. Henderson et al. U.S. Patent No. 3,087,002, e.g., combinations of boron with carbon, silicon, aluminum, beryllium, magnesium, germanium, tin, phosphorus, titanium, zirconium, hafnium, cobalt, manganese and the rare earths of type *4f*, particularly carbon. Other examples of high temperature thermoelectric materials include silicon carbide or mixtures of silicon and carbon in substantially the proportions required for molecular silicon carbide, boronated graphite, platinum/rhodium alloys, etc. Less heat-resistant thermoelectric materials include, e.g., indium phosphide or arsenide, lead, bismuth, or antimony, selenides or tellurides or mixtures thereof, germanium silicide or mixtures of germanium and silicon in substantially molecular proportions, etc. The thermoelectric materials generally contain small quantities of electricity-directing additives commonly known as dopants or promoters. Dispersants, employed to improve mechanical and/or thermal characteristics of the thermoelement are often also present. The thermoelement may contain one or any number of layers of one or more thermoelectric materials with or without a graphite end or ends and/or graphite interposed between each layer of thermoelectric material and bonding all of the layers into an integral body, so long as at least one graphite/thermoelectric junction is overlapped by a casing of graphite. Bonds of great mechanical strength, high resistance to thermal shock and low electrical resistance are thus achieved to an extent which has not been found to be obtainable with prior methods.

Fabrication of the graphite-incased thermoelements is readily conducted by compacting the components under heat and pressure into a shaped mass, using a die-liner of graphite. The pressing and heating is preferably performed by the so-called "hot-pressing" operation, wherein pressure and temperature are applied simultaneously to a die containing the thermoelement components in its liner. Depending upon the thermal properties of the thermoelectric materials, the hot-pressing is conducted either in one operation or step-wise. Thus, where the thermoelectric materials are heat-stable over substantially the same temperature range, a graphite die liner is charged with alternating layers of graphite and the comminuted thermoelectric materials and the die liner with its contents is inserted into a die and heated while holding it under pressure. When the thermoelectric materials possess substantially different stabilities, a layer of one particulated thermoelectric and a layer of graphite may be hot-pressed in absence of the adhering liner to give a solid piece which is subsequently charged to a graphite die liner containing a second and less thermally stable thermoelectric. Heating and pressing the three-tiered assembly under conditions which are favorable to said second thermoelectric, i.e., at a temperature and pressure which will cause the second thermoelectric to fuse and mold without decomposition, results in a graphite-enclosed, integral unit. Segmented thermoelements containing any number of alternating layers of thermoelectric material and graphite may thus be provided with a graphite casing.

To reduce weight and control thermal and electrical shunting, the graphite casing may be machined to reduce its wall thickness to say, from 0.01" to 0.1", and/or to remove portions of the liner which are substantially superfluous insofar as mechanical and electrical properties are concerned, so long as there is allowed to remain a sufficient portion of the liner to provide for a continuous overlapping of at least one graphite-thermoelectric junction. Although a junction which is adjacent to the hot-end of the thermoelement is the junction which it is preferred to incase, overlapping of any of the graphite/thermoelectric junctions serves to decrease electrical resistance and to increase the mechanical strength of the thermoelement. Also, a casing for only the junction area may be provided, of course, by inserting a properly dimensioned graphite ring into an outwardly extending portion or flange of a non-graphitic liner which does not adhere to the thermoelement components during compact.

In order to obtain optimum bonding of the thermoelectric material to any of the graphitic elements, it is advantageous to roughen one or both of the surfaces of the graphite which are to come into contact with the thermoelectric material. Thereby the contact area is increased and bond strength improved. The roughening may be done by abrading with a file, by grooving the surface in criss-cross fashion, etc. In large scale operation, discs of the graphite having one or both surfaces serrated and die liners with coarsened interior surfaces may be premolded.

In bonding the thermoelectric material to the graphite, whether it be the casing or the graphite ends and/or interlayers, it is necessary that the temperature at which the pressing is conducted be sufficient to fuse the thermoelectric material, but insufficient to decompose it. Usually, best results are obtained by employing a temperature which is at least 30% of the melting point of the thermoelectric material but below 200% of the melting point of said material. The pressure will depend, of course, on the temperature which is used. When the temperature approaches, say 200% of the melting point, a pressure as low as, say 50 p.s.i. is sufficient. However, when the temperature is only about 30% of the melting point, a pressure of about 10,000 p.s.i. may be needed to obtain strong bonding within a reasonable pressing time. Generally, unitized products are obtained by heating at a temperature approximating the melting point, but below the decomposition point of the thermolectric material at a pressure of from say, 30 p.s.i. to 15,000 p.s.i. for a time of, say, from 10 minutes to one hour. Determination of optimum pressing conditions is arrived at by routine procedure and is well within the skill of the art. Obviously, the conditions will vary not only with the nature of the thermoelectric material but also with the size and shape of the desired thermoelement; hence, it is recommended that in experimental runs, a series of pressings under varying conditions of temperature be conducted in order to arrive at those which are best suited for the particular job at hand.

The invention is further illustrated by, but not limited to, the following examples:

Example 1

The following thermoelectric formulation was respectively ground into a fine powder (200*f*):

| | Weight percent |
|---|---|
| Silicon | 64.60 |
| Carbon | 26.75 |
| Thorium dioxide | 5.78 |
| Cobalt | 1.47 |
| Calcium oxide | 1.40 |

In the above formulation, cobalt serves as an N-type dopant and the thorium dioxide and the calcium oxide serve as dispersants. The silicon and carbon are present in substantially molecular proportions.

A disc of low electrical resistance grade graphite having a diameter of 0.375" and a thickness of 0.5" was inserted into the bottom of a 0.498 O.D. cylindrical die liner of construction grade graphite, the liner being dimensioned to receive the disc snugly. There was then charged to the liner 2.0 g. of the above formulation to make an even layer on the top surface of the disc. A second graphite disc of the same quality and the same dimensions as those of the first disc was placed on the layer.

Operating as above, a boron nitride liner was charged with the same kind of discs and the same quantity of the formulation.

The charged liners were then inserted into dies and heated in a vacuum of $10^{-3}$ to $10^{-4}$ torr to a temperature of 1400° C. at a rate of 200 C./minute while compressing the charge by exerting on the die ram a pressure which increased at the rate of about 500 p.s.i./minute to 5000 p.s.i. The pressure was maintained while heating was continued at approximately 200° C./minute to a temperature of 2050° C. Heat input was then gradually diminished to allow the dies and their contents to attain room temperature after about ten minutes. At the same time, the pressure was gradually diminished so that by the time that room temperature had been attained, only enough pressure was being exerted to maintain die closure. The compact which had been prepared in the boron nitride liner ejected readily. On the other hand, the graphite liner had become firmly bonded to its contents; a compact could not be removed. The hot pressing had resulted in an integral, well-bonded unit consisting of the graphite liner, the two graphite discs and the thermoelectric formulation. The unit was machined to reduce the diameter of the liner to 0.468" and to remove the liner from a portion of the ends so that only about 0.04" of the thickness of each graphite disc was covered with liner graphite. The unit thus obtained is shown in cross-section in FIGURE 1 of the drawings, wherein TE denotes the thermoelectric material, elements 1 and 2 denote the graphite discs, and element 3 is the graphite casing.

The thus machined, graphite-clad unit and the unclad compact which had been prepared in the boron nitride liner were evaluated for use as N-type legs of thermoelectric couples by determining their electric resistance at a hot-end temperature of 1200° C. That of the clad unit was found to be 0.010 ohm, whereas, that of the unclad compact was found to be 0.021. Use of the graphite casing so as to overlap the interfaces between the thermoelectric material and the graphite end thus resulted in decreasing electrical resistance.

Example 2

The following formulation, instead of that of Example 1, was charged together with graphite discs to a graphite liner and to a boron nitride liner as described in Example 1.

| | Weight percent |
|---|---|
| Germanium | 49.20 |
| Silicon | 44.30 |
| Arsenic | 3.38 |
| Thorium dioxide | 2.98 |

The arsenic of the above formulation is a standard N-type dopant. The thorium dioxide serves as a dispersant.

The charged liners were inserted into dies and heated in vacuum at $10^{-3}$ to $10^{-4}$ torr to a temperature of up to 1345° C. while increasing the pressure to 100 p.s.i., held at that temperature for a few minutes, and then allowed to cool while the pressure was further increased to 1000 p.s.i. As in Example 1, the compact which had been prepared in the boron nitride liner was readily removed from the liner, whereas the graphite liner had become integral with its contents during the pressing and formed a well-bonded casing for the compacted material. The unit was machined as in Example 1, i.e., the diameter of the liner reduced and part of that portion of the liner which covered the periphery of the discs was removed to give a unit wherein all of the thermoelectric material and the adjoining approximately 0.06" portions of each disc were covered by the liner, as shown cross-sectionally in FIGURE 1, wherein TE denotes the layer of thermoelectric material and elements 1 and 2 denote the graphite discs which are tightly bonded thereto and element 3 is the residue of graphite liner which is tightly bonded to the thermoelectric material and to a portion of each of the discs, overlapping the thermoelectric/graphite disc junctions.

The unclad compact which had been prepared in the boron nitride liner and that which had been prepared in the graphite liner and subsequently machined were tested for heat stability by submitting one end thereof to a temperature of 920° C. for one hour. Catastrophic failure of the unclad compact occurred. On the other hand, there was no evidence of damage when the graphite-clad compact was tested at this temperature at 1000° C., at 1100° C., or at 1200° C. for one hour at each of these temperatures. When used as the N-type leg of a thermocouple at a hot-end temperature of 1101° C., 0.117 watt of power was obtained.

Further machining of the graphite-clad unit to reduce the extent of coverage to only the graphite disc/thermoelectric bonding area at the hot-end was employed in order to reduce the weight of the unit. This was done by removing all of the liner graphite except an annular portion circumferentially disposed about and firmly bonded to the unit to overlap the graphite disc/thermoelectric junction by about 0.04" at each side of the junction. There was thus obtained the unit shown cross-sectionally in FIGURE 2 of the drawings, wherein TE denotes the thermoelectric material, elements 11 and 12 are the graphite end discs, and element 13 is the ring of remaining graphite liner. In order to determine whether this mere overlap of the graphite disc/thermoelectric bond could decrease the electrical resistance it was compared to an unclad unit prepared as described above in a boron nitride liner from the same thermoelectric formulation and with the same kind of graphite discs. Because the unclad unit had been found to lack resistance to higher temperatures, testing was conducted by submitting the hot-ends of both units to a temperature of 900° C. The electrical resistance of the unclad unit was found to be 0.015 ohm, whereas that of the unit of FIGURE 2, wherein the graphite disc/thermoelectric bond had been overlapped by the liner graphite, was found to be 0.006. Use of only the small band of graphite liner material thus served to decrease the electrical resistance to less than one-half the value which is obtained without the band.

Example 3

In this example there were prepared thermoelements having two segments of thermoelectric materials, one segment being compacted from the formulation of Example 1 and the other segment from the formulation of Example 2.

Two like compacts, denoted as A and B were prepared in a boron nitride liner from the formulation of Example 1, employing the procedure of that example.

A boron nitride liner of the same dimensions was then charged with a graphite disc and the latter was covered with 2.0 g. of the formulation of Example 2 as in that example. Then, instead of placing another disc on the layer, compact A was used as the die ram in a hot-pressing operation conducted as in Example 2; i.e., heating to 1345° C. at up to 1000 p.s.i. The resulting thermoelement is shown in cross-section in FIGURE 3 of the drawings, wherein element 21 is the graphite disc bonded to the compacted thermoelectric formulation of Example 1 denoted as TE–1 and serving as the hot junction, element 22 is an interleafing disc of graphite bonded to said TE–1 and to the thermoelectric formulation of Example 2 denoted as TE–2, and element 23 is a graphite disc bonded to said TE–2 and serving as cold junction. This thermoelement will be referred to hereinafter as the unclad, segmented element.

An 0.468" (15/32") O.D. cylindrical graphite liner was charged with a graphite disc and the latter was covered with 2.0 g. of the formulation of Example 2, as described in that example. Then, instead of placing another disc on the layer, compact B, was employed as a die ram using a temperature of up to 1345° C. and a pressure of up to 1000° C. as in that example. The resulting body was an integral unit wherein the graphite liner, its charge, and the compact B were all bonded together. This unit is shown in FIGURE 4 of the drawings, wherein TE–1 and TE–2 denote the compacted formulation of Examples 1 and 2, respectively, elements 31, 32 and 33 are graphite discs bonded thereto and element 34 is the tightly adhering graphite liner. The unit has very good strength characteristics and is suitable for use directly as the N-type leg of a thermoelectric couple. However, in applications where weight is critical, the external surface of the bonded liner can be machined to a very thin layer without sacrifice of strength characteristics. Even more advantageously, there may be retained only that portion of the liner which covers and overlaps the disc which bonds the two thermoelements. Thus the integral unit was machined to remove the base of the liner and the lower part of the wall, retaining circumferentially on the unit only the upper, annular portion of the liner which was bonded to said disc and to a small portion, say, about 0.04" of each of the adjacent, compacted thermoelectric formulations. The thermoelement thus obtained is shown cross-sectionally in FIGURE 5 of the drawings wherein TE–1 and TE–2 are the compacted formulations of Examples 1 and 2, elements 41, 42 and 43 are graphite discs bonded thereto and element 44 is the retained, annular portion of the graphite liner.

Figure 3:
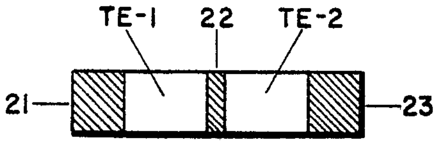

The unclad segmented thermoelement prepared above and depicted in FIGURE 3 and the thermoelement which was prepared as described above to include the annular member of graphite and which is depicted in FIGURE 5 were tested for electrical resistance. When the hot ends, i.e., the graphite end disc 21 of FIGURE 3 and disc 41 of FIGURE 5 were subjected to a temperature of 1200° C. the overall resistance of the unclad element of FIGURE 3 was found to be 0.036 ohm and that of the partially clad thermoelement of FIGURE 5 was found to be 0.024 ohm. The retained portion of the graphite, i.e., the annular member 44, not only serves to lower the resistance of the thermoelement, but it also serves to strengthen the bonding area of the two thermoelectric segments at that portion of the element wherein there exists maximum susceptibility to heat. The reduction in electric resistance indicates that any increase in electrical resistance caused by the joining of the two thermoelectric materials is compensated for by shunting from one thermoelectric material through the annular member and into the second thermoelectric material. It will be noted that electric resistance of the unclad compact of Example 1, which corresponds to compact B of this example, was determined to be 0.021 when subjected to 1200° C. Even though the length of partially clad segmented thermoelement of FIGURE 5 is almost twice that of the nonsegmented uncoated compact of Example 1, its electrical resistance at the same test temperature was found to be only 0.024.

Fabrication of the thermoelectric bodies according to the presently provided process may be conducted in air or in controlled atmospheres of vacuum, e.g., at $10^{-3}$ to $10^{-5}$ torr or in an inert gas such as nitrogen or argon. Optimum control is obtained by working in either vacuum or in an inert atmosphere. Heating may be conducted by means of a furnace or by electrically heating the die. Low-frequency induction may be used for obtaining temperatures in excess of, say 1200° C. When manufacturing large quantities of shaped bodies which are to have the same thermoelectric properties, e.g., as in the fabrication of thermoelectric n-type legs for use in a multi-couple thermoelectric generator or thermopile, use of automatic temperature and pressure controls in order to assure bodies having uniform thermoelectric properties is recommended.

The particle size of the charge is not critical so long as it is finely comminuted, i.e., the particles may be of any size within the micron size range, e.g., below 325 Tyler mesh (below 100 Tyler mesh in some cases) and ranging from, say, 1 micron to 100 millimicrons.

The graphite employed for the discs may be used in any form, i.e., it may be a solid, molded mass or it may be granulated or otherwise finely comminuted. Conveniently, solid, premolded graphite fabricated into the desired shape, is employed. As will be appreciated by those skilled in the art, the lower the electrical resistance of the graphite discs, the better; and, in order to impart maximum strength characteristics, structural grade graphite is preferred for the casing.

Thermoelectric bodies made according to the present process are especially useful as thermoelectric legs of couples for high temperature operation wherein large differences ($\Delta T$) between the hot- and cold-ends of the thermocouple legs make for high output of electrical power. The bodies may be shaped into any desired form, e.g., into cylindrical, rectangular rods or wafers for use as thermocouple components in thermoelectric apparatus generally, e.g., in power generators, cooling units, and in all devices, including thermionic units or diodes and fuel cells where a power generating assembly indicates operation and use of thermoelectric materials at high temperatures. Thermocouples comprising the presently fabricated elements are formed by coupling a thermoelement, produced as herein described, with a substantially equally thermally stable thermoelectric body of opposite sign, i.e., those of the presently produced bodies which have n-type characteristics may be coupled with any convenient p-type body, and a p-type body produced by the present process may be coupled with any convenient n-type body.

While various specific examples have been described herein, it is to be understood that the invention is not limited in its scope to the embodiments described herein, but only as described in the appended claims.

I claim:

1. A segmented thermoelement comprising a shaped body consisting essentially of a graphite cold end and a graphite hot end, and interposed between and integral with said ends, two segments of different semi-conductor thermoelectric materials bonded together by a thin layer of graphite and having a graphite casing firmly bonded to and circumferentially extending over the exterior surface of the graphite layer and overlapping the junctions of said layer with the thermoelectric materials, said layer of graphite providing a thermal shock resistant bond with said segments and a barrier which essentially prevents migration of themoelectric material from one segment to another of said segments and said graphite casing decreasing the electrical resistance and increasing the thermal stability of the segmented thermoelement.

2. The thermoelement defined in claim 1, further limited in that one of the thermoelectric segments is obtained from a finely comminuted mixture consisting essentially of silicon and carbon in a substantially molecular proportion.

3. The thermoelement defined in claim 1, further limited in that one of the thermoelectric segments is obtained from a finely comminuted mixture of germanium and silicon in a substantially molecular proportion.

4. The thermoelement defined in claim 1, further limited in that one of the thermoelectric segments is obtained from a finely comminuted mixture consisting essentially of silicon and carbon in substantially molecular proportions and the other segment is obtained from a finely comminuted mixture consisting essentially of germanium and silicon in substantially molecular proportions.

References Cited

UNITED STATES PATENTS

| | | | |
|---|---|---|---|
| 262,110 | 8/1882 | Patterson | 136—238 |
| 2,152,153 | 3/1939 | Ridgway | 136—222 |
| 2,229,481 | 1/1941 | Telkes | 136—236 X |
| 3,051,767 | 8/1962 | Fredrick et al. | 136—205 X |
| 3,084,534 | 4/1963 | Goton. | |
| 3,256,699 | 6/1966 | Henderson | 136—239 X |
| 3,279,955 | 10/1966 | Miller et al. | 136—205 |
| 3,281,921 | 11/1966 | Danko et al. | 136—202 X |
| 3,285,017 | 11/1966 | Henderson et al. | 136—239 X |

ALLEN B. CURTIS, *Primary Examiner.*

U.S. Cl. X.R.

136—201, 205, 230, 239; 264—105